United States Patent

Goy et al.

Patent Number: 5,119,035
Date of Patent: Jun. 2, 1992

[54] MILLIMETER AND/OR SUBMILLIMETER NETWORK VECTOR ANALYZER

[75] Inventors: Philippe Goy; Michel Gross, both of Paris, France

[73] Assignee: AB Millimetre, France

[21] Appl. No.: 589,206

[22] Filed: Sep. 28, 1990

[30] Foreign Application Priority Data

Sep. 29, 1989 [FR] France ................. 89 12766

[51] Int. Cl.$^5$ ........................................ G01R 23/14
[52] U.S. Cl. ................... 324/639; 324/633; 324/637; 455/226.1
[58] Field of Search .......... 324/633, 636, 637, 638, 324/639, 642; 455/226

[56] References Cited

U.S. PATENT DOCUMENTS

| | | | |
|---|---|---|---|
| 3,866,118 | 2/1975 | Ghosh et al. | 324/58.5 |
| 4,733,165 | 3/1988 | Richardson et al. | 324/636 |
| 4,853,613 | 8/1989 | Sequeira et al. | 324/638 X |
| 4,868,494 | 9/1989 | Ryder et al. | 324/637 X |

FOREIGN PATENT DOCUMENTS 0150410  8/1985  European Pat. Off. .

OTHER PUBLICATIONS

Cullen et al., "A precise Injection Locked I.F. Phase Shifting Technique and its Application to Microwave Q Factor Measurement", *CPEM Digest 1976, IEEE Conference on Precision Electromagnetic Measurements*, Jun. 28–Jul. 1, 1976, pp. 40–41.
Reghinot, "Appareils et méthodes de measures hyperfréquences", *Toute l'Electronique*, No. 501, 1985, pp. 30–37.
Bathiany, "Analyseurs de R,acu/e/ seau: Une Nouvelle Génération d'appareils", *Toute l'Electronique* (TE), No. 526, 1987, pp. 64–70.

*Primary Examiner*—Jack B. Harvey
*Assistant Examiner*—Glenn W. Brown
*Attorney, Agent, or Firm*—Hill, Van Santen, Steadman & Simpson

[57] ABSTRACT

A millimeter and/or submillimeter network vector analyzer comprises a millimeter source and a millimeter heterodyne receiver, and the network to be analyzed is placed between the source and the receiver. The millimeter source comprises a first microwave source feeding a millimeter harmonic generator. The millimeter heterodyne receiver comprises a millimeter harmonic mixer which is fed by a second microwave source which serves as a local oscillator for it, an HF (high frequency) vector receiver and a device for displaying the characteristics of the analyzed network. The analyzer includes a device for servocontrolling the frequency of emission of the second microwave source by the frequency of the first microwave source (or conversely), and a main HF (high frequency) oscillator activating this servocontrol device. The main oscillator is also directly used as a phase reference for the HF (high frequency) vector receiver. Both the millimeter harmonic generator fed by the first microwave source and the millimeter harmonic mixer of the millimeter heterodyne receiver operate at the same harmonic order. The analyzer makes possible vector measurements in all millimeter and submillimeter bands up to the terahertz frequency range without corresponding directional couplers or microwave frequency synthesizer.

18 Claims, 4 Drawing Sheets

MILLIMETER AND/OR SUBMILLIMETER NETWORK VECTOR ANALYZER

The invention relates to a millimetre and/or submillimeter network vector analyzer. Network vector analyzers measure the amplitude and phase response of linear networks and components, the former having two terminations: an input and an output. The analyzers perform the comparison between the incident electromagnetic signal and the signal transmitted, or reflected, by the studied network or component, generally referred to as device under test. To express the results of the measurement, the S parameters are used which enable simple and complete characterization of the devices under test with the relative amplitude variation and the phase-angle rotation of the signal. There are four parameters $S_{ij}(F)$, where i ($=$ 1 or 2) represents the output termination of the signal (detection side), and j ($=$ 1 or 2) represents the input termination (source side). The (F) notation expresses a dependence of these parameters on the frequency F of the signal. Thus, $S_{11}(F)$ is the reflection response measured at the termination 1 of the device under test, with the signal applied at this same termination 1, $S_{21}(F)$ is the transmission response, received at the termination 2 under the same excitation conditions at 1 of the device under test ...

The network vector analyzer of the invention enables measurement of the S parameters in a very extended frequency range. It is particularly well-suited for working in the domain extending from about 8 GHz up to 1000 GHz. Given the currently existing components, it enables good accuracy to be obtained in this frequency domain, but its field of application is not in principle frequency limited.

Conventionally, a network vector analyzer comprises a source and a receiver, the network to be analyzed requiring to be placed between the source and the receiver.

The document EP-0,150,410 for example, describes a network vector analyzer. In each millimeter operation, for example towards 100 GHz, the source is a first microwave source followed by an order N harmonic generator. The receiver is a multi-stage heterodyne receiver wherein the first frequency conversion is performed by an order N'-harmonic detector activated by a second microwave source. The frequency tuning of the receiver on the millimeter source is obtained by using two synthesizers as microwave sources, programmed via a common high-speed bus so that the frequency scannings are performed whilst maintaining this tuning, with different harmonic orders N and N'.

Moreover, the phase reference necessary to the vector receiver is obtained by sampling part of the millimeter power being directed towards the device under test by way of a directional coupler. This energy is detected by a harmonic mixer in the same way as in the main measurement branch. Thus, at one and the same time are obtained a phase reference and, incidentally a control of the incident millimeter power.

These arrangements have turned out to be complicated and expensive, and given the currently available components, the spectral domain of application of the network vector analyzers which is thus constituted, is limited.

SUMMARY OF THE INVENTION

The subject of the invention is therefore a millimeter network vector analyzer whose design enables simple, inexpensive construction, and whose measurement domain may be extended in frequency.

To this end, the invention relates to a millimeter and/or submillimeter network vector analyzer of the type comprising a millimeter source and a millimeter heterodyne receiver, the network to be analyzed requiring to be placed between the said source and the said receiver. The millimeter source comprises a first microwave source feeding a harmonic generator. The millimeter heterodyne receiver comprises, firstly a millimeter harmonic mixer fed by a second microwave source which serves as a local oscillator for it, a HF (high frequency) vector receiver and means for displaying the characteristics of the network analyzed. According to the invention, the millimeter network vector analyzer comprises a device for servocontrolling the emission frequency of the second microwave source by the frequency of the first microwave source (or conversely), and a main HF (high frequency) oscillator activating this servocontrol device. The main oscillator is also directly used as phase reference for the HF (high frequency) vector receiver. The harmonic generator serving as millimeter source and the harmonic mixer at the input of the millimeter heterodyne receiver operate at the same harmonic order.

Preferably, this harmonic order may be freely specified between 1 and 100.

BRIEF DESCRIPTION OF THE DRAWINGS

The invention will be described in detail below, with reference to the attached drawings in which.

DESCRIPTION OF THE PREFERRED EMBODIMENTS

Figure 1:
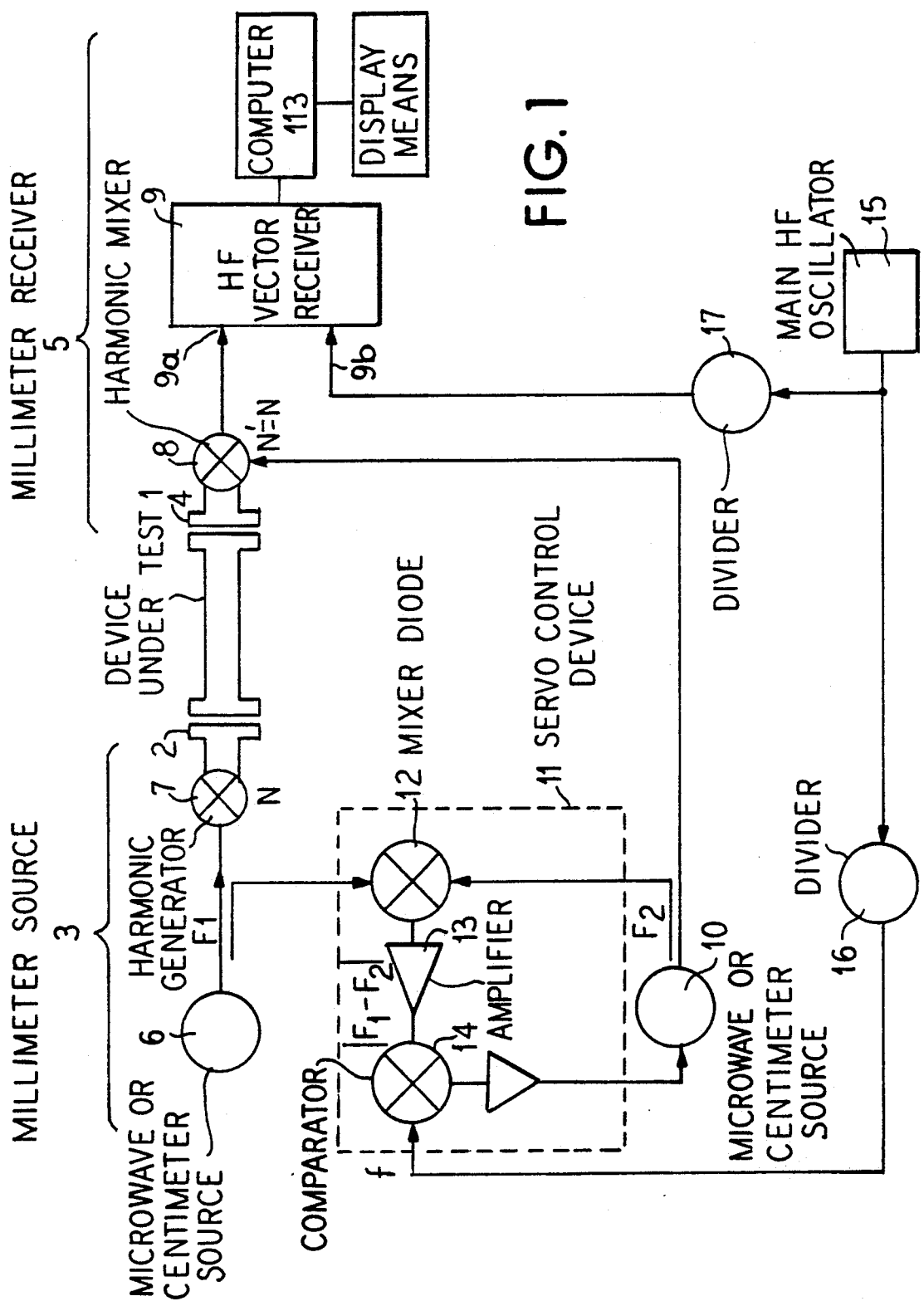
FIG. 1 is a schematic representation of the millimeter network vector analyzer according to the invention.

The network to be analyzed 1 also referred to as device under test (DUT), is placed between the output face 2 of the millimeter source 3 and the input face 4 of the millimeter heterodyne receiver 5.

The millimeter source 3 comprises a microwave source, for example a centimeter source 6, known as -first microwave source- whose frequency $F_1$ is multiplied by the order N-harmonic generator 7, in such a way as to supply the desired millimeter wave, with frequency $F_{mm} = NF_1$. The variation of the emission frequency $F_1$ of the source 6 via means described in detail further on, and the use of various harmonic orders N, enable production of the scanning of the emission frequency of the millimeter source 3 in the domain of study of the network 1.

Here, millimeter frequencies are understood to be frequencies greater than 20 GHz, centimeter frequencies, frequencies lying between 1 and 20 GHz, and HF (high frequency) frequencies lying between 1 and 500 MHz.

The millimeter receiver 5 comprises a harmonic mixer 8 and a vector receiver 9 tunable in the HF domain.

The harmonic mixer 8 possesses as local oscillator, a second microwave source, for example a centimeter source 10, known as —second microwave source—. The emission frequency $F_2$ of this second microwave source 10 is controlled by the servocontrol device 11 in relation to the emission frequency $F_1$ of the first source 6. The frequency difference $|F_2 - F_1|$ is maintained constant and equal to f, of the order of a few MHz.

The servocontrol device 11 comprises a mixer diode 12 fed by part of the fluxes emitted respectively by the sources 6 and 10 and producing a signal depending on the difference of their frequency. After amplification by the amplifier 13 this signal feeds a comparator 14 whose second input is fed, after frequency division, preferably by sixteen, by the divider 16, by the reference HF oscillator 15 known as the main oscillator. By phase locking, produced by the servocontrol device 11, the frequency difference signal $|F_2 - F_1| = f$ is thus frequency- and phase- tied to the main HF oscillator 15.

After conversion of the millimeter wave in the harmonic mixer 8 placed at the input of the heterodyne receiver 5, the HF vector receiver 9 is fed at 9a by signals at the intermediate frequencies $F_{if} = |F_{mm} - N'F_2|$ where N' is the harmonic order of the harmonic mixer 8. Under the conditions $N' = N$ and $f = |F_2 - F_1|$, the HF selective vector receiver 9 will choose, from among the fixed frequencies $F_{if} = Nf$, that with the adopted harmonic N.

Field-effect transistor oscillators, of the same type, electrically tunable (for example from 8 to 18 GHz) by the resonance of an yttrium-iron garnet (Yig) cavity, are used as microwave sources 6 and 10. The harmonic mixer 8 operates at the same harmonic order N as the harmonic generator 7. The harmonic generator 7 and mixer 8 are advantageously Schottky diode devices.

The servocontrol device 11, operating entirely in the HF and centimeter wave bands, therefore makes it possible to achieve, with known and relatively inexpensive components, the matching of the millimeter receiver 5 to the emission frequency of the millimeter source 3, with the harmonic mixer 8 operating at the same harmonic order N as the multiplier 7.

The main oscillator 15 also serving as reference for the tunable HF vector receiver 9, phase coherence is preserved.

Figure 2:
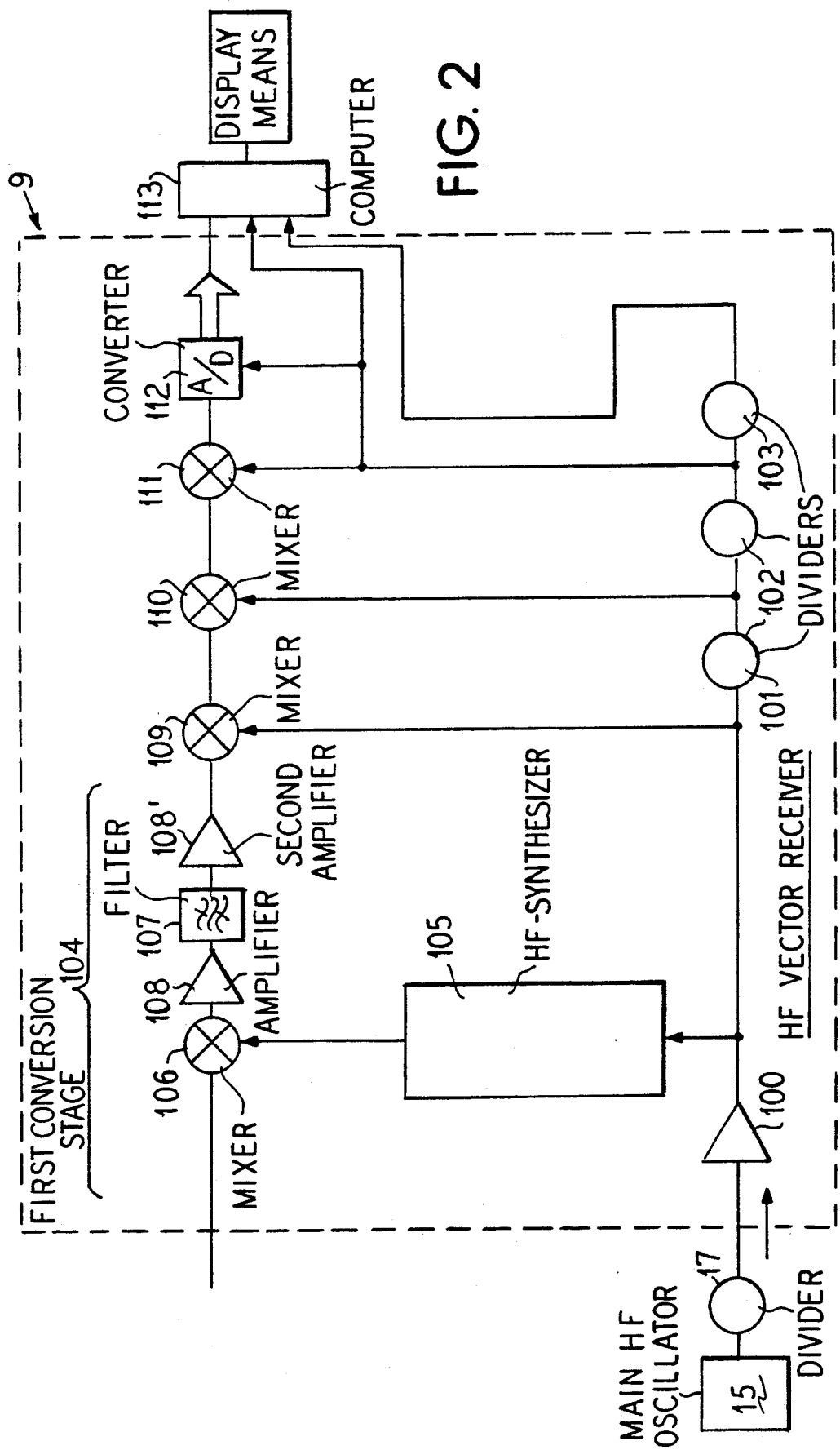
FIG. 2 is a detailed schematic representation of the HF (high frequency) vector receiver implemented in the device of the invention.

The vector receiver 9 is shown in FIG. 2. It comprises several frequency changes, each achieved with the aid of a local phase-referenced oscillator. These references are obtained by dividers cascading from the reference supplied by the oscillator 15.

The main oscillator 15 provides a reference signal, preferably at 50 MHz. Its frequency is divided by the divider 17, preferably by five. The reference at 10 MHz is amplified by the amplifier 100, the divider 101 provides a reference at 1 MHz, the divider 102 a reference at 10 kHz and, finally, the divider 103 a reference at 250 Hz. All these references are phase-stabilized on the 50 MHz signal emitted by the main oscillator 15.

The numerical values are given by way of example. Nevertheless, those which are indicated offer the advantage of avoiding any scrambling by harmonic coincidence between the frequency $f = 3.125$ MHz and the other references at 50 MHz and 10 MHz coming from the main HF oscillator 15.

As we saw earlier, the HF vector receiver 9 receives a signal at a frequency f, for example 3.125 MHz or one of its harmonics Nf.

The first conversion stage 104 comprises a HF synthesizer 105 operating between 0 and 300 MHz, which takes its reference 10 MHz from the signal issuing from the main oscillator 15. The HF synthesizer 105 is capable of supplying frequencies $Nf + f'$ (preferably $f' = +/- 9.01025$ MHz) with the L necessary power (15 mW for example). This first stage 104 also comprises a passive mixer 106 fed, on the one hand, by the measurement signal at the frequency Nf, and on the other hand, by the signal supplied by the HF synthesizer 105. This mixer 106 therefore produces a beat signal on its output at a constant frequency of 9.01025 MHz, carrier of the phase and amplitude information of the measurement signal. At the output of the mixer 106 the signal is amplified by an amplifier 108 followed by a filter 107 at the frequency 9.01025 MHz, which eliminates any interference from this signal. Finally, a second amplifier 108' is applied to the filtered signal.

The following stages each comprise a mixer, 109, 110 and 111 respectively, whose local oscillator channel is fed by a 10 MHz, 1 MHz and 10 kHz signal respectively, obtained by successive divisions of the frequency of the signal supplied by the main oscillator 15. The mixer 109 whose local oscillator is at 10 MHz, produces a 989.75 kHz signal at its output; the mixer 110 whose local oscillator is at 1 MHz, supplies a 10.25 kHz signal at its output; the mixer 111 whose local oscillator is at 10 kHz provides a 250 Hz frequency signal at its output. The mixers 109, 110 and 111 are active mixers, for which the mixer function conversion loss is compensated by a built-in amplifier.

At the output of the mixer 111, after the final frequency conversion at 250 Hz, an analog-digital converter 112 digitizes the measurement signal by sampling at a frequency of 10 kHz. The sampling clock is obtained by dividing the 10 Hz signal emitted by the main oscillator 15. The signal thus digitized feeds a computer 113 which is programmed in such a way as to exploit this 250 Hz frequency signal together with the 10 kHz sampling clock and with a 250 Hz reference signal also L produced by a frequency division from the main 10 MHz HF oscillator 15, in such a way as to extract, store and display the amplitude and phase information from the measurement signal. This computer 113 is able to supply any type of representation of the amplitude and of the phase of the measurement signal as a function of the emission frequency of the source 3. It displays the characteristics of the network analyzed.

The first possible embodiment is the polar representation of the amplitude and of the phase, where the amplitude is the distance to the center and the phase the angle which the direction of the point under consideration makes with an origin axis.

This type of two-dimensional polar representation makes it difficult to represent these parameters as a function of a third variable, such as the frequency for example. This is the reason for usually independently representing the variations of phase and those of amplitude, as a function of the frequency, or of time, or of the angle of an antenna position, etc., in a cartesian system.

Figure 4A:
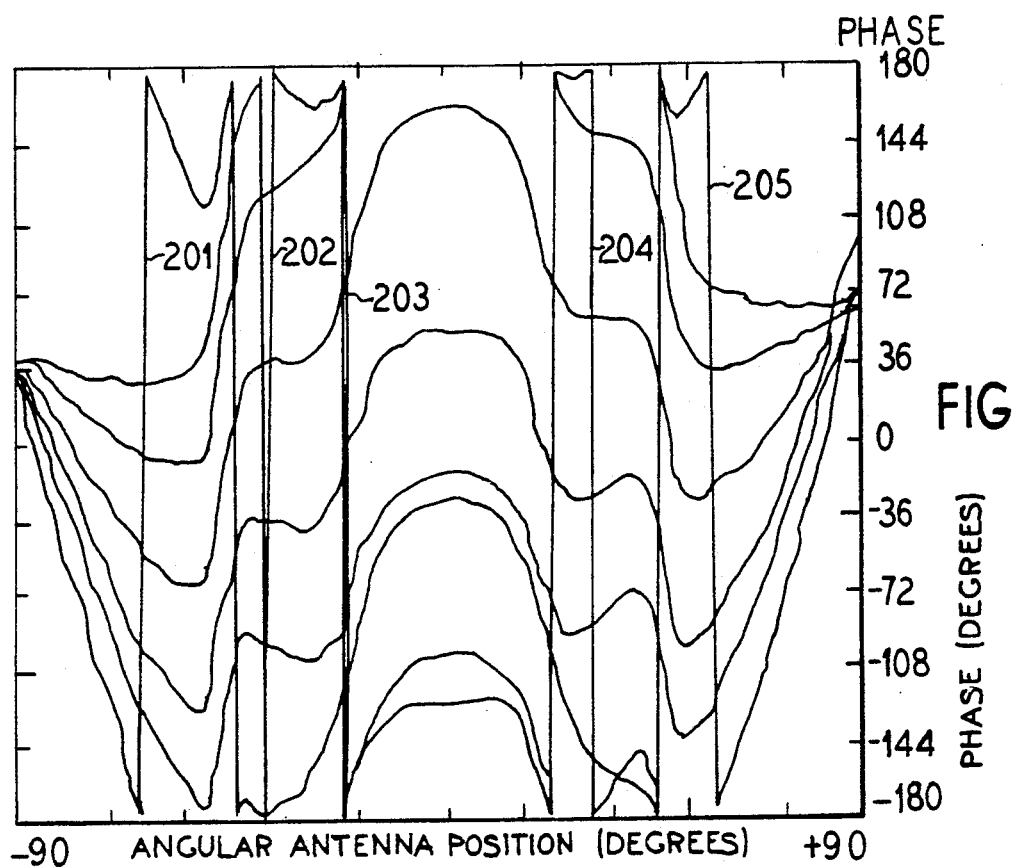
FIGS. 4A and 4B are graphs with FIG. 4B being an example of continuous display of the phase of a signal in a domain of variation greater than 360° in comparison with FIG. 4A which is a representation of the same signal carried out in the conventional manner.

In this event, representation of the phase in cartesian coordinates is confined to an amplitude of 360°, and generally the diagram is confined between −180° and +180°. In the case of millimeter network analyzers the continuous phase variation frequently exceeds 360°. In this event, cartesian representation takes the form of a sawtooth curve (FIG. 4A) with apparent discontinuities when the phase attains values of more or less 180°. These discontinuities, which do not correspond with any physical reality, are problematic.

So as to illustrate the representation of the measurement signal, FIG. 4 shows the result of a test in which the component studied is an antenna. In this case the antenna to be tested is placed on a rotating pin opposite an emitting antenna positioned sufficiently far away for the incident wave to be considered plane at the location of the antenna under test. FIG. 4 shows the phase delay of the received signal as a function of the setting direction of the receiving antenna for various separations of the mouth of the antenna under test, relative to the rotation axis.

Figure 4B:
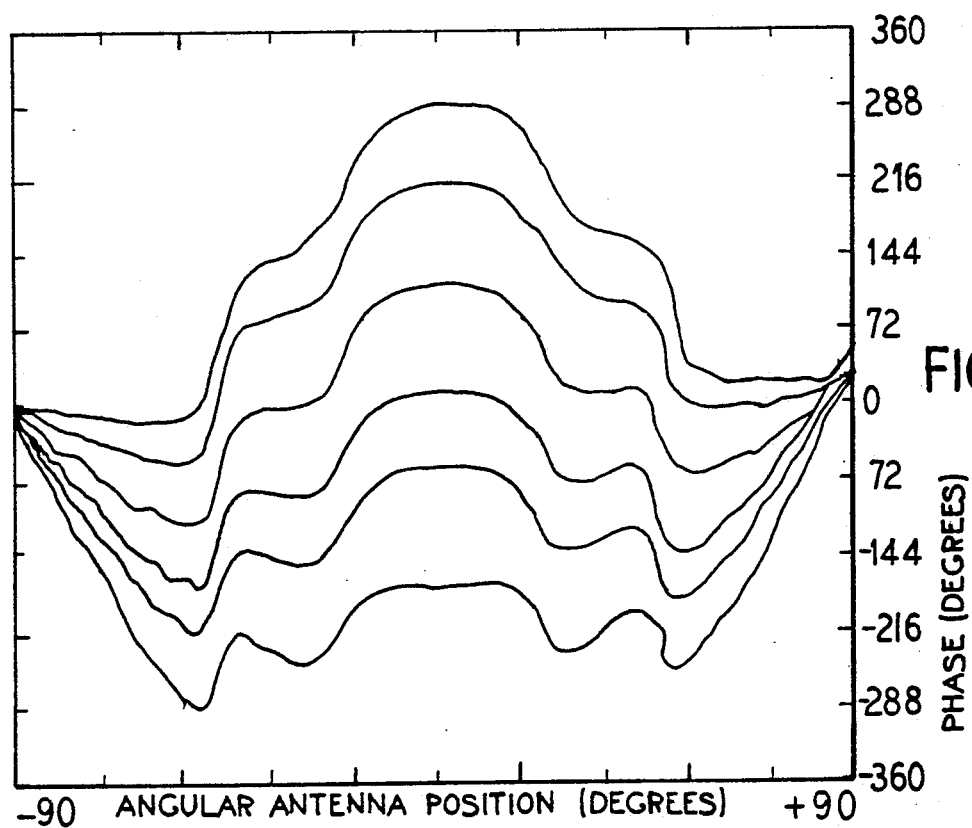

One particularly advantageous embodiment in the context of the study of millimeter vector networks consists in suppressing any nonphysical discontinuity of the phase in its cartesian representation. To this end, the computer 113 extracts the amplitude A and the phase u from the signal supplied in real time by the analog-digital converter 112. The phase, lying between −180° and +180°, is placed in memory. On reading back, the computer is programmed in such a way as to recognize, through studying the slope of the phase, sudden discontinuities such as labelled 201 to 205 in FIG. 4A. These discontinuities then being considered as the product of the representation and not of a physical phenomenon, 360° is added to their lower bound. The computer then adapts the scale in such a way as to enable a complete representation of the signal, such as shown in FIG. 4B. This type of representation is referred to as continuous phase representation.

Figure 3:
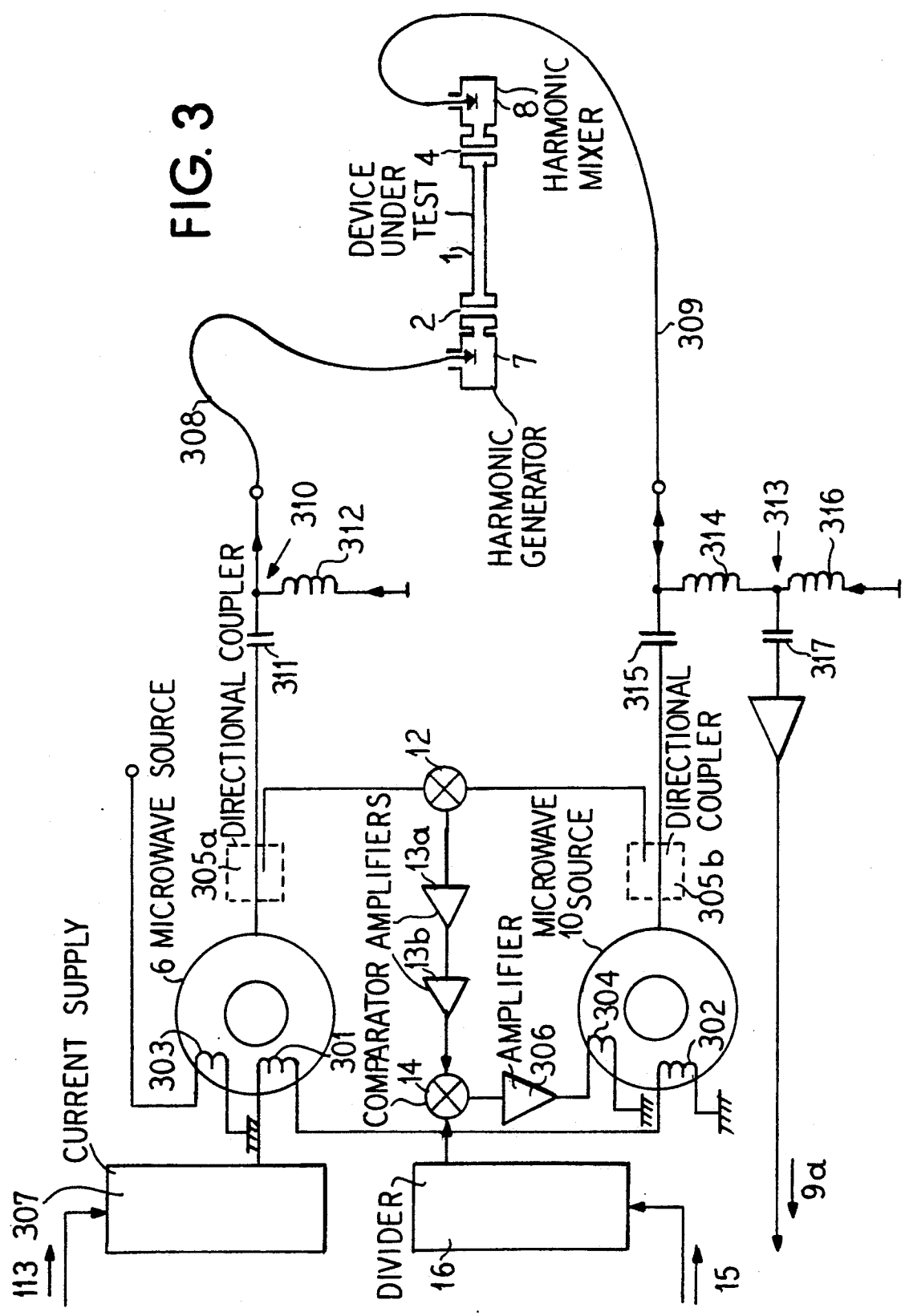
FIG. 3 is a detailed schematic representation of the microwave portion of the device of the invention.

We will now describe in more detail the sources and their connections with reference to FIG. 3.

The first and second microwave sources 6 and 10 are field-effect transistors oscillators followed by amplification-isolation stages. They are broadly sweepable by virtue of activation by 8 to 18 GHz yttrium-iron garnet (known as Yig) crystal resonant cavity. They supply an output power of the order of 100 milliwatts with a centimeter power spectrum exhibiting a width at half-height of the order of 10 kHz. Yig cavities exhibit magnetic resonance. They are subjected to the magnetic field created by two types of coils; the main coil (301 and 302 respectively) ensures the rough positioning of the frequency of each source 6 and 10. The secondary coils, 303 and 304 respectively, enable the rapid performance of low amplitude frequency corrections (up to 100 MHz). The main coils 301 and 302 are series mounted in such a way as to avoid any relative shift which might be due to a fluctuation in the current supply. They are fed by a controlled and adjustable supply 307.

The mixer 12 of the servocontrol device 11 is a Schottky diode capable of operating between 0.1 MHz and 18 GHz. The diode is fed, on the one hand, by part of the flux emitted by the source 6 sampled by a directional coupler 305a and, on the other hand, by part of the flux emitted by the source 10 sampled by a directional coupler 305b. These couplers are chosen so that the order of the signal sampled from the flux emitted by one of the sources is of higher order (about 10 mW) than that sampled from the flux emitted by the other, so that the more intense flux serves as local oscillator to the Schottky diode 12 operating as mixer.

The diode 12 supplies a beat signal whose frequency lies between zero and 60 MHz approximately. A first amplifier 13a raises the order of the signal a first time and sends it to a saturation amplifier 13b in such a way that it drives the frequency/phase comparator 14 with a constant level. The other branch of this comparator 14 is fed by a reference signal, at frequency f, for example at 3.125 MHz, produced by division by the frequency divider 16 from the signal emitted by the main HF oscillator 15. The correction voltage generated by the comparator 14 is amplified by the amplifier 306 and sent to the secondary coil 304 of the source 10 whose frequency is thus regulated to that of the source 6.

The secondary coil 303 of the source 6 may advantageously be used to perform the external stabilization of this source. However, it should be stressed that this stabilization is not indispensable. During modification of the harmonic working order of the multiplier 7 and hence likewise of the harmonic mixer 8, the tuning of the HF receiver is modified, which makes it possible to avoid modification of the difference of the emission frequencies of the sources 6 and 10.

The harmonic generator 7 and the harmonic mixer 8 are respectively connected to the microwave sources 6 and 10 by flexible coaxial cables 308 and 309. At its end opposite the harmonic generator 7 the cable 308 comprises a bias tee 310 consisting of an inductor 312 and a capacitor 311 which enable it to combine the signal emitted by the microwave source 6 and the direct current for polarizing the harmonic generator 7. At its end opposite the harmonic mixer 8 the cable 309 comprises a double bias tee 313, consisting of a first inductor-capacitor 314, 315 assembly followed by a second assembly of the same kind 316, 317. This double tee 313 enables the cable 309 to simultaneously transport the HF signal received at the harmonic mixer 8, the direct current for polarizing this mixer, and the signal emitted by the second microwave source 10 in the direction of this same harmonic mixer.

The arrangement shown in FIGS. 1 or 3 enables measurement of the parameter $S_{21}$, which corresponds to the operation of the millimeter network studied by transmission. Use of a directional coupler, then inversion of the respective functions of the source and of the receiver, enable analogous access to the other parameters $S_{ij}$, in traditional manner.

The device of the invention enables network vector analysis by fully covering the millimeter domain. The means which it requires are light and efficient and, in particular, it does not necessitate microwave frequency synthesis nor any directional coupler for control of the incident wave. The implemented detectors and sources are maneuverable and light. As we have seen, the reference phase is obtained directly at the HF signal level, which simplifies the equipment and enables very high operating frequencies to be attained.

Moreover, the dynamic range available is sizeable. With currently available components the dynamic range exceeds 80 dB at 100 GHz and attains 50 dB at 300 GHz, with phase noise less than 0.2° and 1° respectively.

The means described above enable complete coverage of the millimeter domain and of the lower end of the submillimeter domain, for example up to 450 GHz. The submillimeter measurement domain can be extended by choosing millimeter sources instead of the two microwave sources 6 and 10, or instead of one of them. For instance, a 100 GHz Gunn diode oscillator frequencystabilized on the harmonic 7 of the microwave source 6, and followed by a harmonic generator of rank R($3 \leq R \leq 10$), can be used as a submillimeter source at the frequency $R \times 100$ GHz. It permits to work up to 1000 GHz with the millimeter receiver tuned for the harmonic orders $N'=21$ (for 300 GHz detection) to $N' = 70$ (for 1000 GHz detection). The equipment then continues to conform with the invention, in particular the main HF oscillator is used directly as phase reference.

We claim:

1. In a millimeter and/or submillimeter network vector analyzer comprising: a millimeter source and a millimeter heterodyne receiver, the network to be analyzed being placed between the said source and the receiver, the millimeter source comprising a first microwave source feeding a millimeter harmonic generator, the millimeter heterodyne receiver comprising a millimeter harmonic mixer fed by a second microwave source which serves as a local oscillator for one mixer, an HF vector receiver and means for displaying the characteristics of the network being analyzed, the improvements comprising said analyzer including a servocontrol device for servocontrolling an emission frequency of the second microwave source by the frequency of the first microwave source, and a main HF oscillator activating said servocontrol device, the said main HF oscillator also being directly used as a phase reference for the HF vector receiver, the millimeter harmonic generator being fed by the first microwave source, and the millimeter harmonic mixer of the millimeter heterodyne receiver operating at the same harmonic order.

2. In a millimeter network vector analyzer according to claim 1, wherein the harmonic order common to the millimeter harmonic generator and the millimeter harmonic mixer is specified between 1 and 100.

3. In a millimeter network vector analyzer according to claim 2, wherein the first and the second microwave sources comprise field-effect transistor oscillators, each activated by resonance in a Yig cavity.

4. In a millimeter network vector analyzer according to claim 3, wherein the HF vector receiver is tunable.

5. In a millimeter network vector analyzer according to claim 4, wherein the HF vector receiver comprises several stages for converting a beat signal, in such a way as to decrease the frequency whilst conserving the amplitude and phase information, each of the stages comprising a local HF oscillator phase-tied to the main HF oscillator.

6. In a millimeter network vector analyzer according to claim 5, wherein the local HF oscillator of a first stage is a programmable HF synthesizer.

7. In a millimeter network vector analyzer according to claim 6, wherein the local HF oscillators of the stages following the first stage are obtained by dividing the frequency of the main HF oscillator.

8. In a millimeter network vector analyzer according to claim 5, which includes an analog/digital sampler digitizing the signal supplied by the final stage and a computer fed by a measurement signal leaving the sampler and by a reference signal produced by frequency division from the main HF oscillator, said computer being programmed in such a way as to extract, store and display the amplitude and phase information from the measurement signal.

9. In a millimeter network vector analyzer according to claim 8, wherein the computer carries out a deferred, continuous display of the phase even when its field of variation is greater than 360°.

10. In a millimeter network vector analyzer according to claim 4, characterized in that the Yig cavities of each microwave source comprise a main coil and a secondary coil controlling their respective frequencies, and that the servocontrol device for servocontrolling the emission frequency of the second microwave source by the frequency of the first microwave source comprises a first coupler enabling sampling of part of a flux emitted by the first microwave source, a second coupler enabling sampling of part of a flux emitted by the second microwave source, a mixer producing a beat signal from the sampled fluxes and feeding a phase comparator which controls the frequency of the second microwave source via the secondary coil of the second microwave source for controlling the Yig cavity thereof, the main coil of the second microwave source being in series with that of the main coil of the first microwave source.

11. In a millimeter network vector analyzer according to claim 1, wherein the first and the second microwave sources comprise field-effect transistor oscillators, each activated by resonance in a Yig cavity.

12. In a millimeter network vector analyzer according to claim 11, wherein the Yig cavities of each microwave source comprises a main coil and a secondary coil controlling their respective frequencies, and that the device for servocontrolling the emission frequency of the second microwave source by the frequency of the first microwave source comprises a first coupler enabling sampling of part of a flux emitted by the first microwave source, a second coupler enabling sampling of part of a flux emitted by the second microwave source, a mixer producing a beat signal from the sampled fluxes and feeding a phase comparator which controls the frequency of the second microwave source via the secondary coil for controlling the Yig cavity thereof, the main coil of the second microwave source being in series with the main coil of the first microwave source.

13. In a millimeter network vector analyzer according to claim 1, wherein the HF vector receiver is tunable.

14. In a network vector analyzer according to claim 13, wherein an analog/digital sampler digitizing the signal supplied by the final conversion stage and a computer fed by a measurement signal leaving the sampler and by a reference signal produced by frequency division from the main HF oscillator, the computer being programmed in such a way as to extract, store and display the amplitude and phase information from the measurement signal.

15. In a millimeter network vector analyzer according to claim 14, wherein the computer carries out a deferred, continuous display of the phase even when its field of variation is greater than 360°.

16. In a millimeter network vector analyzer according to claim 1, wherein the HF vector receiver comprises several stages for converting the beat signal, in such a way as to decrease the frequency whilst conserving the amplitude and phase information, each of the stages comprising a local HF oscillator phase-tied to the main HF oscillator.

17. In a millimeter network vector analyzer according to claim 16, characterized in that the local HF oscillator of the first stage is a programmable HF synthesizer.

18. In a millimeter network vector analyzer according to claim 17, characterized in that the local HF oscillators of the stages following the first stage are obtained by dividing the frequency of the main HF oscillator.

* * * * *